United States Patent [19]

Kudo

[11] Patent Number: 5,237,367
[45] Date of Patent: Aug. 17, 1993

[54] ILLUMINATING OPTICAL SYSTEM AND EXPOSURE APPARATUS UTILIZING THE SAME

[75] Inventor: Yuji Kudo, Yokohama, Japan
[73] Assignee: Nikon Corporation, Tokyo, Japan
[21] Appl. No.: 811,665
[22] Filed: Dec. 23, 1991

[30] Foreign Application Priority Data

Dec. 27, 1990 [JP] Japan ................. 2-407624

[51] Int. Cl.$^5$ .................. G03B 27/54; F21V 7/04
[52] U.S. Cl. ................................ 355/67; 355/53; 362/268
[58] Field of Search .............. 355/53, 67; 362/311, 362/268; 353/122, 101

[56] References Cited

U.S. PATENT DOCUMENTS

| 4,497,015 | 1/1985 | Konno et al. ............ | 362/268 |
| 4,851,978 | 7/1989 | Ichihara ................. | 362/268 |
| 4,939,630 | 7/1990 | Kikuchi et al. .......... | 362/268 |

FOREIGN PATENT DOCUMENTS 59-155843  9/1984  Japan.

*Primary Examiner*—Richard A. Wintercorn
*Attorney, Agent, or Firm*—Shapiro and Shapiro

[57] ABSTRACT

An illuminating optical system comprises parallel light beam generating means for providing a parallel light beam, a first optical integrator for substantially forming a first planar light source by the light beam coming from the parallel light beam generating means, a first condensing optical system for condensing the light beam from the first planar light source, a second optical integrator for substantially forming a second planar light source by the light beam condensed by the first condensing optical system, and a second condensing optical system for illuminating an illuminated plane in overlapping manner by condensing the light beam from the second planar light source formed by the second optical integrator.

At least either of the first optical integrator and the first condensing optical system has a variable focal length, and the size of the second planar light source is rendered variable while the size of the illuminated area is maintained constant, through a change in the focal length.

23 Claims, 5 Drawing Sheets

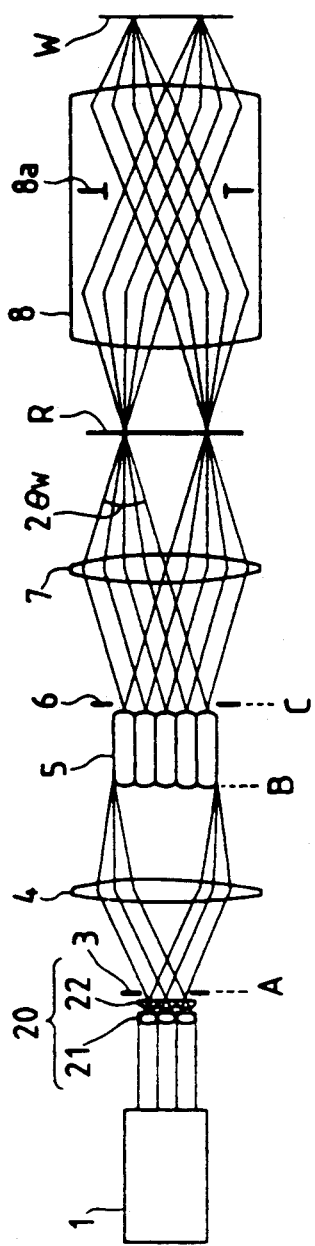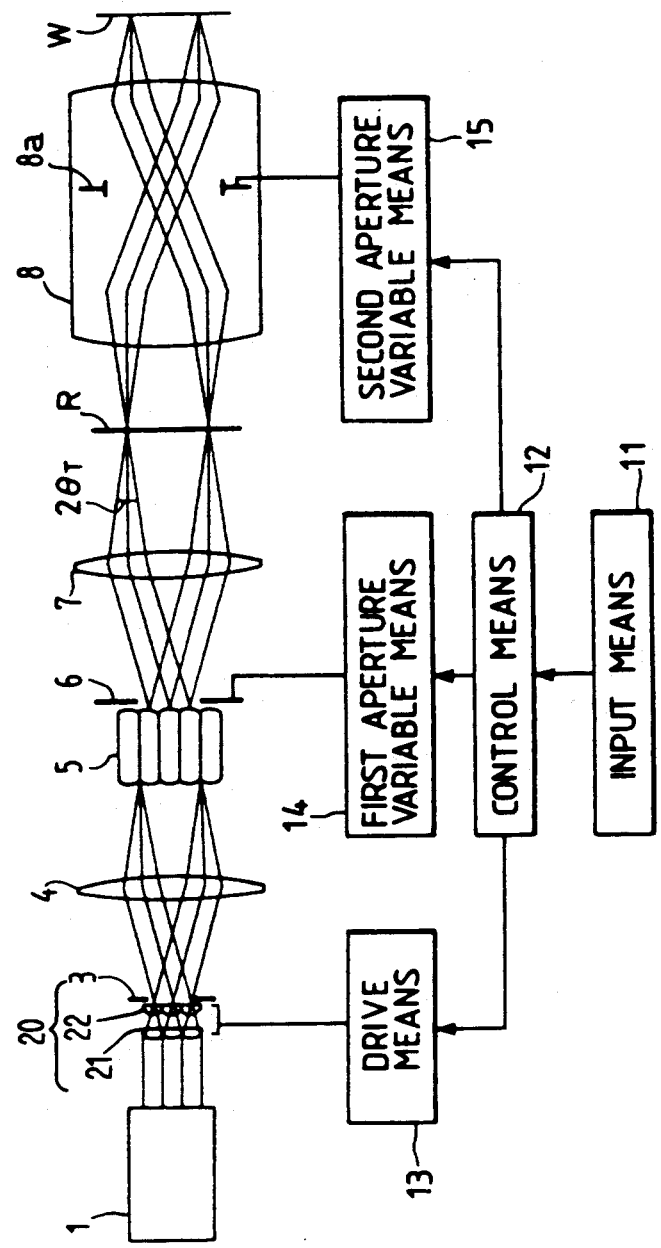
FIG. 1A
FIG. 1B

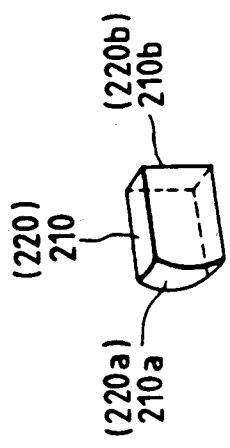
FIG. 2
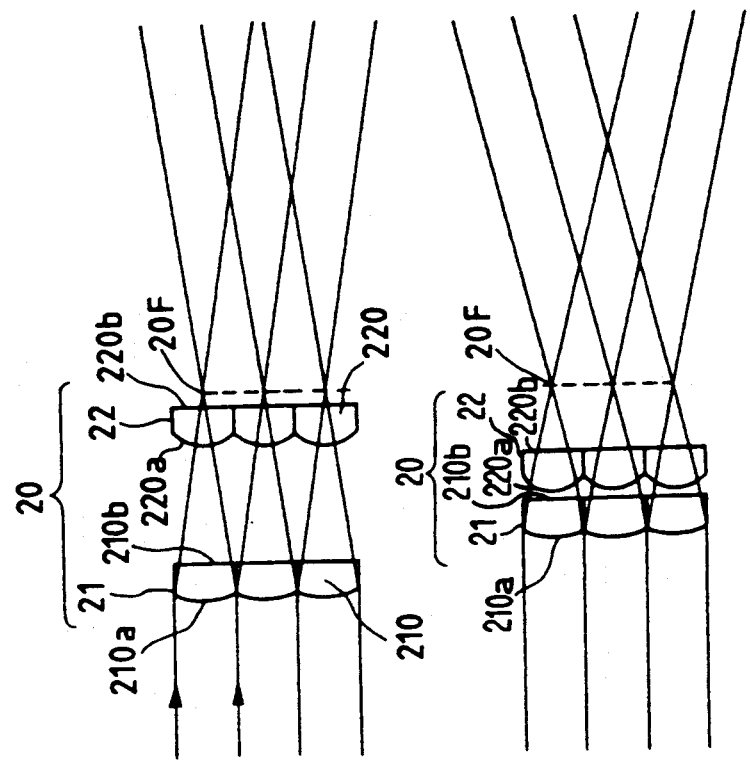
FIG. 3B
FIG. 3A

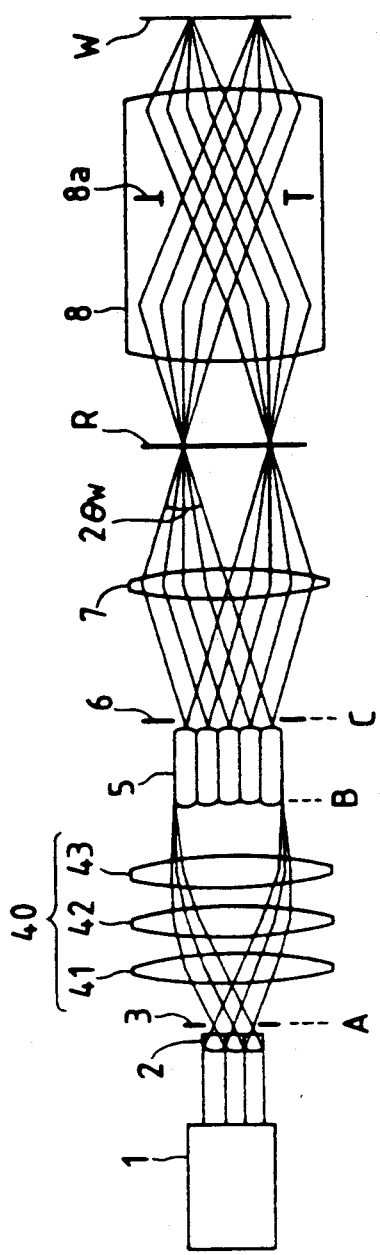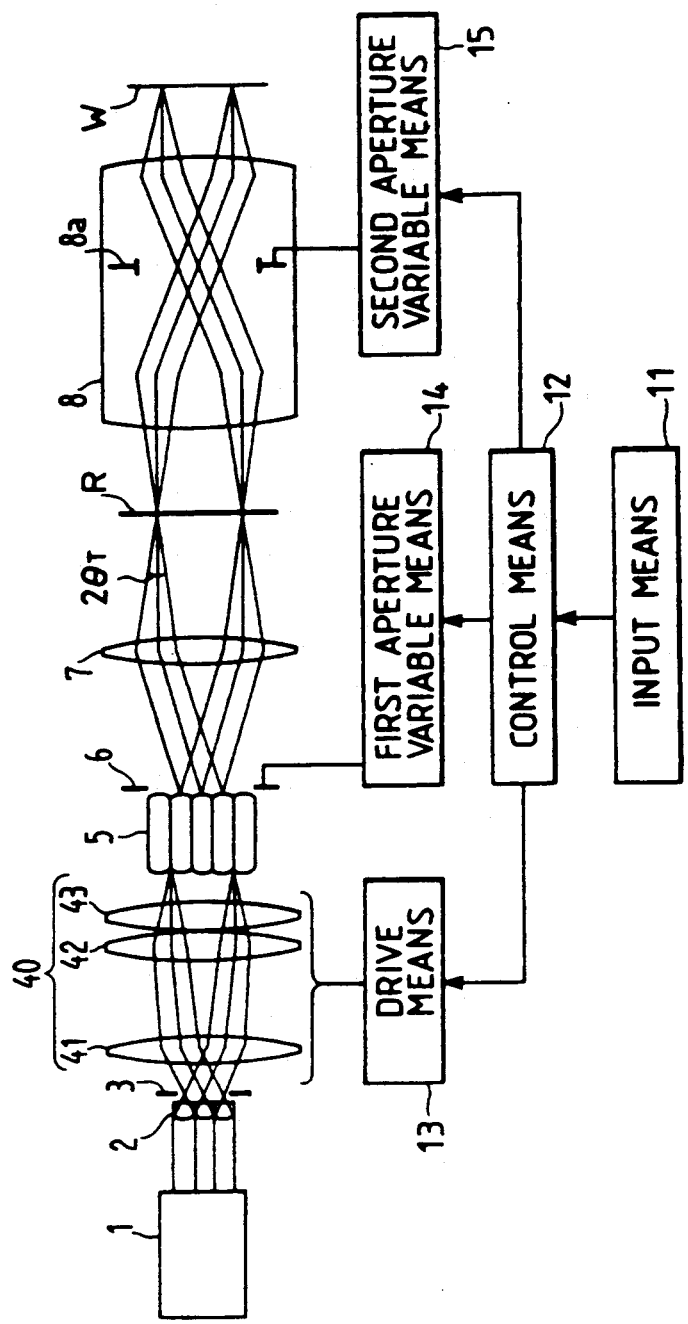
FIG. 6A
FIG. 6B

ILLUMINATING OPTICAL SYSTEM AND EXPOSURE APPARATUS UTILIZING THE SAME

BACKGROUND OF THE INVENTION

1. Field of the Invention

The present invention relates to an illuminating optical system adapted for use in semiconductor device manufacture, and an exposure apparatus utilizing such optical system.

2. Related Background Art

Reduction projection exposure apparatus have been employed for the manufacture of semiconductor devices with ultrafine patterns such as LSI (large scale integrated circuits) or VLSI (very large scale integrated circuits), and great efforts have been continued to achieve transfer of finer patterns. For responding to such reduction in the dimension of patterns, there has been explored the increase in the numerical aperture (N.A.) of the projection optical system, together with the use of a shorter wavelength in the exposing light, and projection optical systems with N.A. exceeding 0.5 have been realized.

In the actual projection exposure utilizing the projection optical system with such large numerical aperture, the optimization of illuminating conditions is an important factor. For this reason there is proposed, for example in the Japanese Patent Laid-open Application No. 59-155843, to regulate socalled $\sigma$-value corresponding to the ratio of the N.A. of the illuminating optical system to that of the projection optical system, in order to obtain an appropriate balance between the resolving power and the contrast.

In said proposal, a variable diaphragm with a variable aperture is positioned at the exit side of a fly's eye lens where a secondary light source image is formed in the illuminating optical system, and the size of the light source image is controlled by varying the size of aperture of said variable diaphragm. Said $\sigma$-value corresponds to the ratio of the size of the light source image of the illuminating optical system, formed on the pupil of the projection optical system, to the size of said pupil of the projection optical system. Therefore, the numerical aperture of the illuminating optical system has been practically varied by a change in the size of the light source image, through a change in the level of light shielding on an actually formed light source image, and the optimization of the illuminating condition, or of the $\sigma$-value, has been achieved so as to optimize the balance of the resolving power and the contrast, according to the size of the pattern to be projection exposed.

In such optical apparatus, there is generally required a high illumination intensity on the illuminated plane (mask or reticle), in order to improve the throughput at the exposure of fine patterns.

However, in the above-explained conventional apparatus, when the aperture of the variable diaphragm is reduced in order to optimize the illuminating condition, or the $\sigma$-value, for obtaining an optimum balance of the resolving power and the contrast on a predetermined pattern according to the fine pattern to be projection exposed, there will result a significant loss in the amount of light in the peripheral part of the secondary light source image, due to the shielding by the variable diaphragm. Thus, although the illumination intensity on the illuminated plane (mask or reticle) becomes maximum when the $\sigma$-value is selected largest (when the aperture of the variable diaphragm is made largest), said illumination intensity becomes lower when a smaller $\sigma$-value is selected (when the aperture of the variable diaphragm is made smaller), thus leading to a fatal drawback of a reduced through-put.

SUMMARY OF THE INVENTION

In consideration of the foregoing, the object of the present invention is to provide an illuminating optical system of high performance, capable of efficiently guiding the illuminating light to the illuminated plane and achieving a uniform and higher illumination intensity, without loss in the throughput resulting from the loss of amount of light even when the $\sigma$-value is varied, and an exposure apparatus utilizing such illuminating optical system.

For attaining this object, the present invention intends to vary the size of the light source image of the illuminating optical system without any loss in the amount of light, utilizing a fact that the $\sigma$-value corresponds to the ratio of the size of the light source image of the illuminating optical system, formed on the pupil of the projection objective lens, to the size of said pupil of the projection objective lens, and a principle of varying the $\sigma$-value while uniformly illuminating the illuminated area with a higher efficiency and without any loss in the amount of illuminating light is reached by constituting at least either one of a first optical integrator substantially forming a first planar light source and a first condensing optical system for condensing the light beam from said first planar light source by a variable-magnification optical system, thereby maintaining the illuminated area at a constant size, and rendering variable the size of a second planar light source (plural images of the first planar light source) formed by a second optical integrator.

The above-mentioned object can be attained, according to an embodiment of the present invention, by an illuminating optical system comprising parallel light beam generating means for providing a parallel light beam; a first optical integrator for substantially forming a first planar light source by the light beam coming from said parallel light beam generating means; a first condensing optical system for condensing the light beam from said first planar light source; a second optical integrator for substantially forming a second planar light source by the light beam condensed by said first condensing optical system; and a second condensing optical system for illuminating an illuminated plane in overlapping manner by condensing the light beam from the second planar light source formed by said second optical integrator;

wherein at least either of said first optical integrator and said first condensing optical system has a variable focal length, and the size of the second planar light source is rendered variable while the size of the illuminated area is maintained constant, through a change in said focal length.

Also according to another embodiment of the present invention, there is provided a projection exposure apparatus for projecting a pattern of a reticle, uniformly illuminated by an illuminating optical system, onto a substrate through a projection optical system, wherein said illuminating optical system comprises parallel light beam generating means for providing a parallel light beam; a first optical integrator for substantially forming a first planar light source by the light beam coming from said parallel light beam generating means; a first condensing optical system for condensing the light beam from said first planar light source; a second optical integrator for substantially forming a second planar light source by the light beam condensed by said first condensing optical system; and a second condensing optical system for illuminating an illuminated plane in overlapping manner by condensing the light beam from the second planar light source formed by said second optical integrator;

wherein at least either of said first optical integrator and said first condensing optical system has a variable focal length, and the size of the second planar light source is rendered variable while the size of the illuminated area is maintained constant, through a change in said focal length.

As the present invention enables uniform illumination of the illuminated plane with a high illumination intensity, without any loss in the amount of light, there can be obtained an illuminating optical system and an exposure apparatus of excellent performance, completely free from any loss in the throughput even when the $\sigma$-value is selected at an optimum value according to the minimum line width to be exposed and the desired depth of focus.

Other objects of the present invention, and the features and advantages thereof, will become fully apparent form the following detailed description, to be taken in conjunction with the attached drawings.

BRIEF DESCRIPTION OF THE DRAWINGS

FIGS. 1A and 1B are optical path views showing the structure of a first embodiment of the present invention;

FIG. 2 is a perspective view of a lens element constituting a first optical integrator in the first embodiment of the present invention;

FIGS. 3A and 3B are optical path charts of the first optical integrator of the first embodiment;

FIGS. 6A and 6B are optical path charts showing the structure of a second embodiment of the present invention;

DESCRIPTION OF THE PREFERRED EMBODIMENTS

Now the present invention will be clarified in detail by embodiments thereof shown in the attached drawings.

Figure 9:
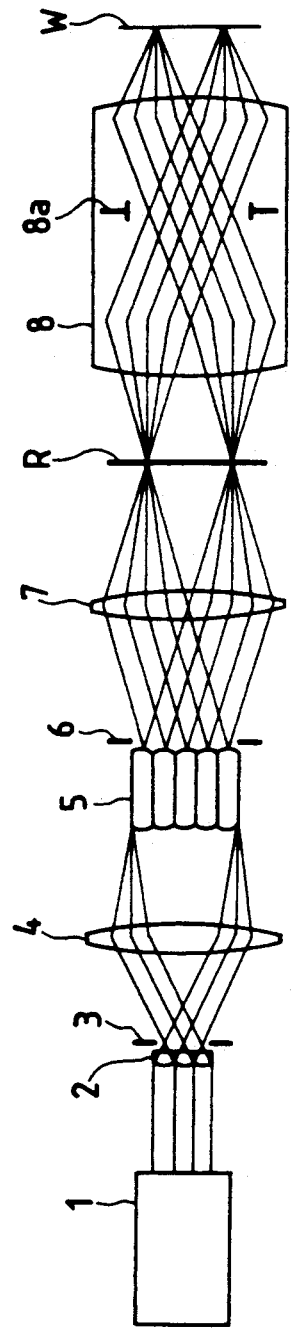
FIG. 9 is an optical path chart showing the structure of a conventional illuminating optical system constituting the basis of the structure of the illuminating optical system of the present invention.

FIGS. 1A to 5 illustrate a first embodiment of the present invention, while FIGS. 6A to 8 illustrate a second embodiment, and FIG. 9 shows the structure of a conventional illuminating optical system constituting the basis of the structure of the illuminating optical system of the present invention.

FIGS. 1A and 1B are optical path charts showing the basic optical structure of the illuminating optical system of the present invention, respectively showing shortest and longest focal length states of a first optical integrator 20. As shown in these drawings, a parallel light beam with a rectangular cross section, coming from a laser light source 1 (parallel light beam generating means) such as an excimer laser, enters a first optical integrator 20 with magnification varying function. Said integrator 20 is provided with a first optical element group 21 and a second optical element group 22 which are rendered axially movable for varying the mutual distance, in order to vary the size of a tertiary light source (secondary planar light source) to be explained later. Each of said first and second optical element groups 21, 22 is composed of plural rod-shaped lens elements 210 or 220 arranged in parallel manner.

Based on the above-explained structure of the first optical integrator 20, the parallel optical beam from the laser light source 1 is subjected to the condensing function of the individual lens elements 210, 220 of the first and second optical element groups 21, 22 to form condensed points of a number equal to that of said lens elements, thereby constituting a substantially planar light source (first planar light source) A as a second light source, at the exit side of the first optical integrator 20. Because of the nature of the laser light source, the light beam from the light source 1 is substantially completely collimated, so that each of the condensed points formed on the plane A can be considered to have a substantially zero dimension.

Each of the lens elements 210, 220 constituting the first and second optical element groups 21, 22 in the first optical integrator 20 has, as shown in FIG. 2, a rectangular cross section corresponding to the cross section of the light beam, with a convex lens face 210a (or 220a) at the entrance side and a flat face 210b (or 220b) at the exit side.

FIGS. 3A and 3B are optical path charts of the first optical integrator, respectively showing shortest and longest focal length states of the first optical integrator 20. As shown in these drawings, the synthesized rear focal position 20F of the mutually opposed lens elements 210, 220 remains constant regardless of the change in magnification, and is always present in the space in the exit side. Consequently, the substantially planar light source A formed by the first optical integrator 20 is always present on the plane A in the exist side space of the first optical integrator 20, without change in the position or in the size even when the magnification is changed. This fact protects the first optical integrator 20 from the destruction by the heat resulting from condensing of the laser beam from a high-power laser unit such as the excimer laser.

In particular, the shape of the lens elements 210 constituting the first optical element group 21 of the zooming optical integrator 20, having a lens face 210a at the entrance side and a flat face 210b at the exit side, suppresses the spherical aberration, thereby reducing the distortion aberration generated by said spherical aberration at the entrance plane of a second optical integrator to be explained later, and further suppressing the loss in the amount of peripheral light in a tertiary light source. On the other hand, a structure of the rod-shaped element 210 having a flat face at the entrance side and a lens face at the exit side is undesirable, because of an undesirable influence on the illumination state on the illuminated plane by a light beam involving a diverging angle or by a slight inclination of the rod-shaped elements 20a, and also because of generation of stray light.

In the present embodiment, each of the lens elements 220 constituting the second optical element group 22 has a lens face at the entrance side and a flat face at the exit side, but said exit side face may be given a lens function.

As shown in FIGS. 1A and 1B, the substantially planar light source (first planar light source) A formed by the first zooming optical integrator 20 is limited to a predetermined size by a fixed diaphragm 3, having a predetermined aperture and provided at the position of said light source A or in the vicinity thereof. The light beam from said substantially planar light source (first planar light source) A is converted into a parallel light beam by a first condenser lens 4, and is guided to a fixed second optical integrator 6. In this state, the light beams from plural light condensation points, formed by the lens elements 210, 220 of the first optical integrator 20 and constituting the first planar light source A, illuminate in overlapping manner an entrance plane B of the second optical integrator 6.

Figure 4:
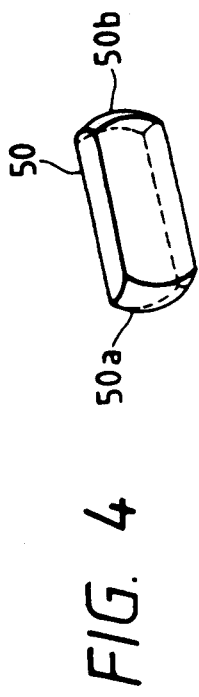
FIG. 4 is a perspective view of a lens element constituting a second optical integrator of the first embodiment.

Said second optical integrator 6 is composed of plural lens elements arranged in parallel manner, and more specifically, as shown in FIG. 4, a bundle of a plurality of rectangular rod-shaped lens elements 50. Each of said rod-shaped lens elements 50 has convex lens faces at the entrance face 50a and the exit face 50b, and forms a light condensation point at the rear focal point on the exit face, thus providing an image of the light source on said point. Thus the entire second optical integrator forms, on the exit face (at the rear focal position), plural light condensation points of a number corresponding to the product of the number of rod-shaped lens elements 210 (or 220) of one of the optical elements groups 21 (or 22) of the first optical integrator 2 and the number of the rod-shaped lens elements 50 constituting the second optical integrator, thereby forming a substantially uniform planar light source as a tertiary light source or a second planar light source, on a plane C.

In the system including the first condenser lens 4 and the entrance plane $50a_1$ of the second optical integrator, the plane A constituting the secondary light source (first planer light source) including plural light condensation points is optically conjugate with the exit face C constituting the tertiary light source (second planar light source) including plural light condensation points.

In the present embodiment, the tertiary light source (secondary planar light source) is formed on the exit face of the second optical integrator 5, but it is naturally possible to form said tertiary light source in the space at the exit side of the second optical integrator, for example by decreasing the lens function of the exit face 50b of each rod-shaped lens element 50 in the second optical integrator, in order to avoid lens destruction by strong light condensation on the face of the lens element or in the interior thereof.

Because of the above-explained structure of the second optical integrator 5, the size of the substantially planar light source (second planar light source) C varies according to the magnification determined by the displacement of the second optical integrator. For this reason, a variable diaphragm 6 with a variable aperture of a predetermined shape is provided at the position C where the substantially planar light source (second planar light source) is formed or in the vicinity thereof, and is capable of suitably varying the aperture according to the change in size of said second planar light source. The light beam from said substantially planar light source (second planar light source), of which size is suitably selected by the variable diaphragm 6, is converted into a parallel beam by a second condenser lens 7 (second condensing optical system) and is guided onto a reticle (mask) R constituting the illuminated plane. Thus the light beams from the plural light condensation points (tertiary light source) C, formed by the rod-shaped lens elements 50 of the second optical integrator 5, illuminate the reticle R in overlapping manner, thereby realizing extremely uniform illumination.

Said reticle R bears a predetermined circuit pattern, which is projected onto a wafer W placed at a position conjugate with said reticle R with respect to a projection lens 8.

In general, in the exposure of a fine pattern, an increase in the numerical aperture of the projection objective lens improves the limit resolving power but reduces the depth of focus, and vice versa. In order to cope with this fact, a variable diaphragm 8a with a variable aperture is provided at the pupil P of the projection lens 8, and a suitable change in said aperture allows to select an optimum value for the minimum line width of the pattern to be exposed, thereby enabling to transfer the fine pattern more sharply onto the wafer while maintaining a relatively large depth of focus.

The variable diaphragm 6 of the illuminating optical system, provided at the position C where the tertiary light source (second planar light source) is formed is optically conjugate with the variable diaphragm 8a at the pupil P of the projection lens 8. Also the overlapping position of plural light beams from the secondary light source A, formed by the first optical integrator 20, namely the entrance face (front focal position) B of the second optical integrator 5, is optically conjugate with the reticle (illuminated plane) R, with respect to the exit lens face 50b of said second optical integrator and the second condenser lens 7.

In the above-explained basic structure of the present invention, the light beams illuminating the entrance face B of the second optical integrator 5 in mutually overlapping manner are so formed, when the first optical integrator 20 is at the shortest focal length, as to have a size, in light beam diameter or light beam width, for approximately covering the entire entrance face B. The magnification change of the first optical integrator 20 from the shortest focal length to the longest one is achieved, as shown in FIGS. 1A, 1B, 3A and 3B, by displacements of the first optical element group 21 of a positive refractive power, constituting the first optical integrator 20, toward the light source and the second optical element group 22 of a positive refractive power toward the illuminated plane. Thus the magnification change is achieved by a change in the emerging angle, without change in the size and the position of the substantially planar light source (first planar light source) formed in the exit side space A of the first optical integrator. Thus the size of the light beams illuminating the entrance face B of the second optical integrator 5 varies to a size, in diameter or in width, covering at least two rod-shaped lens elements 50 in said second optical integrator 5. Such magnification change allows to efficiently vary the size only of the substantially planar light source (second planar light source), formed at the position conjugate with the secondary light source (first planar light source), namely at the exit face C of the second optical integrator 5, without any change in the position of said light source. Thus, as shown in FIG. 1, the change of the first optical integrator 20 from the shortest focal length state to the longest focal length state varies the numerical aperture of the illuminating optical system from N.A.=$\sin\theta_W$ to N.S.=$\sin\theta_T$, whereby the effective numerical aperture of the illuminating optical system is decreased.

As explained above, the magnification varying function provided in the first optical integrator 20 allows to vary the effective numerical aperture of the light beam coming from the illuminating optical system for illuminating the reticle R, without change in the illuminated area thereon, thereby attaining an optimum $\sigma$-value while maintaining a high illuminating efficiency.

Figure 5B:
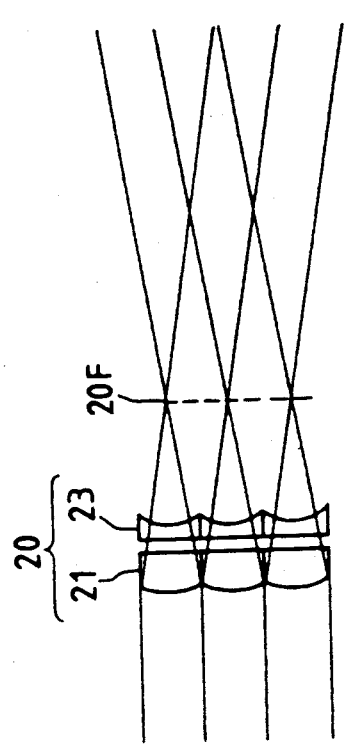
FIGS. 5A and 5B are optical path charts in case the first optical integrator of the first embodiment is composed of a positive lens element group and a negative lens element group.
Figure 5A:
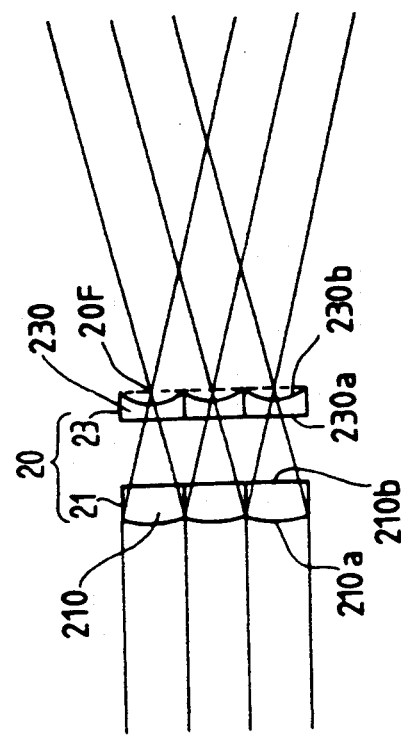

Also as shown in FIGS. 5A and 5B, the first and second optical element groups 21, 22 constituting the first optical integrator 20 may be respectively given a positive refractive power and a negative refractive power. FIGS. 5A and 5B respectively illustrate shortest and longest focal length states of the first optical integrator 20. In this case, each element in the first optical element group 21 has a rectangular cross section, and a convex lens face 210a at the entrance side and a flat face 210b at the exit side, while each element in the second optical element group 22 has a rectangular cross section, and a flat face 230a at the entrance side and a concave lens face 230b at the exit side. The magnification change in the first optical integrator 20 of the above-explained structure from the longest focal length state to the shortest focal length state is achieved by displacements of both the first optical element group 21 and the second optical element group 22 toward the illuminated plane in such a manner that the mutual distance of said groups becomes larger. Such displacements do not vary the position and size of plural light condensation points (first planar light source) A formed in the exit side space of the first optical integrator 20, and vary only the size of the substantially planar light source (second planar light source) C composed of plural light condensation points formed on the exit face of the unrepresented second optical integrator 5, without change in the position of said light source C. As a result it is rendered possible to attain an optimum $\sigma$-value, while maintaining the illuminated plane at a uniform and high illumination intensity.

Furthermore, the first and second optical elements groups 21, 22 constituting the first optical integrator may be respectively given negative and positive refractive powers. Furthermore, though the first optical integrator 20 may be in principle given a sufficient magnification varying function by a structure consisting of two optical element groups, it may include three or more optical element groups.

The foregoing description has principally concentrated on the optical structure, and, in the following, there will be explained the operations for setting the optimum $\sigma$-value, with reference to FIGS. 1A and 1B. When information such as the minimum line width to be exposed, depth of focus of the projection objective lens 8, $\sigma$-value or numerical aperture of the illuminating optical system and numerical aperture of the projection objective lens, are entered into input means 11, said information are stored in a memory of said input means 11 and are displayed on a cathode ray tube monitor of an unrepresented display unit. Then said information are supplied from the memory of the input means 11 to control means 12, and a CPU therein calculates the change of the aperture of the variable diaphragm 8a in order to optimize the numerical aperture of the projection objective lens. Also said CPU calculates the optimum size, on the pupil 8a of the projection objective lens, of the tertiary light source (second planar light source) C formed by the second optical integrator 5, based on the optimum numerical aperture of the projection objective lens, and the corresponding appropriate magnification change, or the amounts of displacement, of the first and second optical element groups 21, 22 constituting the first optical integrator 20.

Then the control means 12 instructs second aperture varying means 15 to regulate the variable diaphragm 8a of the projection objective lens 8 to an appropriate aperture, first aperture varying means 14 to regulate the variable diaphragm 6 of the illuminating optical system to an appropriate aperture, and drive means 13 to displace the first and second optical element groups 21, 22 constituting the first optical integrator 20 in such a manner that the tertiary light source (second planar light source) C assumes an optical size on the pupil P of the projection objective lens. Said drive means 13 is provided with a driving unit including a motor, and a position detector such as an encoder for detecting the position of the first and second optical element groups 21, 22. Also each of the first and second aperture varying means 14, 15 is provided with a driving unit including a motor, and an aperture detector for detecting the aperture. Thus, in response to the output of the control means 12, the variable diaphragm 8a of the projection objective lens 8 and the variable diaphragm 6 of the illuminating optical system are precisely set at the desired apertures, and the first optical integrator 20 is precisely set at the desired magnification. Thus the tertiary light source (second planar light source) formed by the second optical integrator 5 has an appropriate size on the pupil 8 of the projection objective lens, with respect to the size of said pupil, whereby the exposure can be achieved with an optimum $\sigma$-value, under a high illumination efficiency.

Since the $\sigma$-value can be suitably varied under a high illumination efficiency as explained above, the illumination can be achieved under optimum conditions corresponding to the minimum line width to be exposed and the desired depth of focus, without sacrificing the throughput.

The system shown in FIGS. 1A and 1B may be so designed that the input means 11 calculates an appropriate $\sigma$-value from the entered minimum line width only, and, based on thus calculated $\sigma$-value, the control means 12 calculates the apertures of the variable diaphragm 8a of the projection lens 8 and the variable diaphragm 6 of the illuminating optical system, and the amounts of displacement of the first and second optical element groups of the first optical integrator 20, thereby controlling said apertures and the zooming amount of the first optical integrator.

Also in case the reticle R is provided, outside the illuminated area thereof, with a mark, such as a bar code, including information such as the minimum line width on the wafer, mark detection means for detecting such mark may be provided in a suitable position and the control means 12 may be so designed to control the apertures of the variable diaphragm 8a of the projection lens 8 and the variable diaphragm 6 of the illuminating optical system and the amounts of displacement in the first optical integrator 20, according to the information released from said mark detection means. Furthermore, an electrical or mechanical link mechanism may be provided to regulate the aperture of the diaphragm 6 of the illuminating optical system in relation to the displacement in the first optical integrator 20. Furthermore, the variable diaphragm 6 with a variable aperture may be replaced by a turret diaphragm in which a disk, having plural apertures of different sizes, is rotated in linkage with the change of $\sigma$-value.

In the following there will be explained another embodiment of the present invention, with reference to FIGS. 6A and 6B, which respectively illustrate shortest and longest focal length states of a first condenser lens 40. In these drawings, same components as those in FIGS. 1A and 1B are represented by same numbers. The present embodiment is different from the embodiment shown in FIGS. 1A and 1B in that the first optical integrator has a fixed magnification instead of the variable magnification in the foregoing embodiment, while the first condenser lens has a variable magnification.

Figure 7:
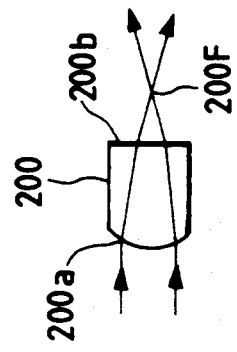
FIG. 7 is a perspective view of a lens element constituting a first optical integrator of the second embodiment.
Figure 8:
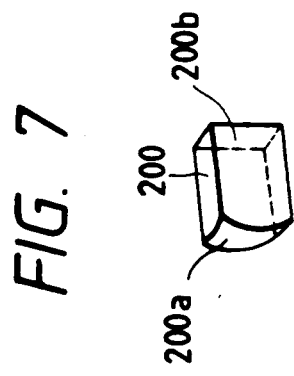
FIG. 8 is an optical path chart of the lens element constituting the first optical integrator of the second embodiment.

Each element constituting a first optical integrator 2 has, as shown in FIG. 7, a rectangular cross section, and a convex lens face 200a at the entrance side and a flat face 200b at the exit side. As shown in an optical path chart in FIG. 8, a substantially planar light source A is present on a plane A, corresponding to the rear focal plane 200F, in the exit side space of the first optical integrator. This fact avoids destruction of the first optical integrator 2 by the heat, generated by condensation of light beam of a high-power laser such as an excimer laser.

A first condenser lens 40 with variable magnification consists of a first lens group 41 of a positive refractive power, a second lens group 42 of a positive refractive power, and a third lens group 43 of a positive refractive power. As shown in FIGS. 6A and 6B, the shift of the first condenser lens 40 from the shortest focal length state to the longest focal length state is achieved by a displacement of the first lens group 41 toward the light source, and displacements of the second and third lens groups 42, 43 by respectively different amounts toward the illuminated plane. Through said displacements, the light beams from plural light condensation points in the secondary light source formed by the first optical integrator 2 can vary the size of the illuminated area on the entrance face B of the second optical integrator 4, without change in the overlapping illuminating positions, whereby the tertiary light source (secondary planar light source) C, formed by said second optical integrator, can be varied in size alone, without change in the position thereof.

Consequently, the present embodiment is capable of controlling only the size of the tertiary light source (second planar light source) formed by the second optical integrator, without any change in the size or position of the secondary light source A formed by the first optical integrator. As a result, as shown in FIGS. 6A and 6B, a magnification change in the first condenser lens 40 from the shortest to longest focal length state varies the numerical aperture of the illuminating optical system from N.A.$=\sin\theta_W$ to $\sin\theta_T$, whereby the effective numerical aperture of the illuminating optical system is reduced and an effect as in the first embodiment can thus be attained. The first condenser lens 40 with variable magnification is so constructed that, despite of a change in the magnification, the front focal position is always at the secondary light source A and the rear focal position is always at the entrance face (front focal position) B of the second optical integrator. Also the first condenser lens 40 with variable magnification may be composed of more than three lens groups, or of a suitable combination of lens groups with positive and negative refractive powers.

The automatic setting of an optimum $\sigma$-value will not be explained as it is achievable by a method as explained in the first embodiment.

Also in either embodiment shown in FIGS. 1A and 1B, or 6A and 6B, a diaphragm 3 for defining the size of the secondary light source (first planar light source) formed in the exit side space of the first optical integrator 2 or 20 may in principle be composed of a fixed diaphragm, but it may also be composed of a variable diaphragm for the purpose of regulating the amount of light. Furthermore, in the foregoing embodiments, the parallel light beam generating means is composed of a light source providing a parallel light beam such as a laser, but there may naturally be employed a light beam obtained for example from a high pressure mercury arc lamp, condensed by an elliptical mirror and converted into parallel state by a collimating lens. Also the cross-section of each rod-shaped lens element constituting the optical integrators may be made circular or polygonal.

Furthermore, the first optical integrator and the first condenser lens may be simultaneously given the zooming function.

What is claimed is:

1. An illuminating optical system comprising:
   parallel beam generating means for supplying a parallel light beam;
   a first optical integrator for forming a first substantially planar light source by the light beam from said parallel beam generating means;
   a first condensing optical system for condensing the light beam from said first planar light source;
   a second optical integrator for forming a second substantially planar light source by the light beam condensed by said first condensing optical system; and
   a second condensing optical system for illuminating an illuminated plane in overlapping manner by condensing the light beam from the second planar light source formed by said second optical integrator;
   wherein at least either one of said first optical integrator and said first condensing optical system has a variable focal length, and the size of said second planar light source is rendered variable by the change in said focal length, while the size of said illuminated area is maintained constant.

2. An illuminating optical system according to claim 1, wherein said first optical integrator includes a first optical element group and a second optical element group, and the mutual distance of said groups is rendered variable for varying the focal length of said first optical integrator.

3. An illuminating optical system according to claim 2, wherein the rear focal position of said first optical integrator and the rear focal position of said second optical integrator are so positioned as to be optically substantially conjugate.

4. An illuminating optical system according to claim 3, wherein, when said first optical integrator is in a shortest focal length state, the light beam entering said second optical integrator from the first planar light source is so formed as to have a size for illuminating the approximately entire area of said second optical integrator, and, when said first optical integrator is in a longest focal length state, the light beam entering said second optical integrator from the first planar light source is so formed as to have a size for illuminating at least two of optical elements constituting said second optical integrator.

5. An illuminating optical system according to claim 4, further comprising a variable diaphragm with a variable aperture of a predetermined shape, at a focal position of said second optical integrator at the side of the illuminated plane or in the vicinity of said focal position, wherein said variable diaphragm is adapted to vary the size of said aperture in linkage with a change in the focal length of said first optical integrator.

6. An illuminating optical system according to claim 1, wherein said first condensing optical system includes a first lens group and a second lens group, and the mutual distance of said lens groups is rendered variable to vary the focal length of said first condensing optical system.

7. An illuminating optical system according to claim 6, wherein the rear focal position of said first optical integrator and the rear focal position of said second optical integrator are so positioned as to be optically substantially conjugate.

8. An illuminating optical system according to claim 7, wherein, when said first condensing optical system is at a shortest focal length state, the light beam entering said second optical integrator from the first planar light source is so formed as to have a size for illuminating the substantially entire area of said second optical integrator, and, when said first condensing optical system is at a longest focal length state, the light beam entering said second optical integrator from the first planar light source is so formed as to have a size for illuminating at least two of optical elements constituting said optical integrator.

9. An illuminating optical system according to claim 8, further comprising a variable diaphragm with a variable aperture of a predetermined shape at a focal position of said second optical integrator at the side of the illuminated plane or in the vicinity of said focal position, wherein said variable diaphragm is adapted to vary the size of said aperture in linkage with a change in the focal length of said first condensing optical system.

10. An illuminating optical system according to claim 1, wherein said parallel beam generating means includes a light source; an elliptical mirror for condensing the light beam from said light source; and a collimating lens for collimating the light beam from said elliptical mirror.

11. An illuminating optical system according to claim 1, wherein said parallel beam generating means includes an excimer laser.

12. A projection exposure apparatus for projecting a pattern of a reticle, uniformly illuminated by an illuminating optical system, onto a substrate through a projection optical system, wherein said illuminating optical system comprises:
- parallel beam generating means for supplying a parallel light beam;
- a first optical integrator for forming a first substantially planar light source by the light beam from said parallel beam generating means;
- a first condensing optical system for condensing the light beam from said first planar light source;
- a second optical integrator for forming a second substantially planar light source by the light beam condensed by said first condensing optical system; and
- a second condensing optical system for illuminating an illuminated plane in overlapping manner by condensing the second planar light source formed by said second optical integrator;

wherein at least either one of said first optical integrator and said first condensing optical system has a variable focal length, and the size of said second planar light source is rendered variable by the change in said focal length, while the size of said illuminated area is maintained constant.

13. A projection exposure apparatus according to claim 12, further comprising:
- a first variable diaphragm provided at the position of said second planar light source;
- a second variable diaphragm provided at the position of the pupil of said projection optical system;
- input means for entering information required for attaining an optimum illumination state;
- drive means for varying the focal length of at least either one of said first optical integrator and said first condensing optical system; and / 15 control means for controlling said first variable diaphragm, said second variable diaphragm and said drive means according to the information entered by said input means.

14. A projection exposure apparatus according to claim 12, further comprising:
- a first variable diaphragm provided at the position of said second planar light source;
- a second variable diaphragm provided at the position of the pupil of said projection optical system;
- drive means for varying the focal length of at least either one of said first optical integrator and said first condensing optical system;
- mark detection means for detecting a predetermined mark, formed on said reticle and including information required for attaining an optimum illumination state; and
- control means for controlling said first variable diaphragm, said second variable diaphragm and said drive means according to the output of said mark detection means.

15. A projection exposure apparatus according to claim 12, wherein said first optical integrator includes a first optical element group and a second optical element group, and the focal length of said first optical integrator is rendered variable by the change in the mutual distance of said optical element groups.

16. A projection exposure apparatus according to claim 15, wherein the rear focal position of said first optical integrator and the rear focal position of said second optical integrator are so positioned as to be optically substantially conjugate.

17. A projection exposure apparatus according to claim 16, wherein, when said first optical integrator is in a shortest focal length state, the light beam entering said second optical integrator from the first planar light source is so formed as to have a size for illuminating the approximately entire area of said second optical integrator, and, when said first optical integrator is in a longest focal length state, the light beam entering said second optical integrator from the first planar light source is so formed as to have a size for illuminating at least two of optical elements constituting said second optical integrator.

18. A projection exposure apparatus according to claim 17, further comprising a variable diaphragm with a variable aperture of a predetermined shape, at a focal position of said second optical integrator at the side of the illuminated plane or in the vicinity of said focal position, wherein said variable diaphragm is adapted to vary the size of said aperture in linkage with a change in the focal length of said first optical integrator.

19. A projection exposure apparatus according to claim 12, wherein said first condensing optical system includes a first lens group and a second lens group, and the mutual distance of said lens groups is rendered variable to vary the focal length of said first condensing optical system.

20. A projection exposure apparatus according to claim 12, wherein said parallel beam generating means includes a light source; an elliptical mirror for condensing the light beam from said light source; and a collimating lens for collimating the light beam from said elliptical mirror.

21. A projection exposure apparatus according to claim 12, wherein said parallel beam generating means includes an excimer laser.

22. An illuminating optical system comprising:
parallel beam generating means for supplying a parallel light beam;
a first optical integrator for forming a first substantially planar light source by the light beam from said parallel beam generating means;
a first condensing optical system for condensing the light beam from said first planar light source;
a second optical integrator for forming a second substantially planar light source by the light beam condensed by said first condensing optical system; and
a second condensing optical system for illuminating an illuminated plane in overlapping manner by condensing the light beam from the second planar light source formed by said second optical integrator;
wherein said first optical integrator includes at least a first lens element group and a second lens element group; and
the size of said second planar light source is rendered variable by the change in the mutual distance of said lens element groups while the size of said illuminated area is maintained constant.

23. An illuminating optical system comprising:
parallel beam generating means for supplying a parallel light beam;
a first optical integrator for forming a first substantially planar light source by the light beam from said parallel beam generating means;
a first condensing optical system for condensing the light beam from said first planar light source;
a second optical integrator for forming a second substantially planar light source by the light beam condensed by said first condensing optical system; and
a second condensing optical system for illuminating an illuminated plane in overlapping manner by condensing the light beam from said second planar light source formed by said second optical integrator;
wherein said first condensing optical system includes at least a first lens group and a second lens group; and
the size of said second planar light source is rendered variable by the change in the mutual distance of said first and second lens groups, while the size of the illuminated area is maintained constant.

* * * * *